United States Patent [19]
Takane et al.

[11] Patent Number: 5,391,989
[45] Date of Patent: Feb. 21, 1995

[54] MAGNETIC RESONANCE IMAGING METHOD AND APPARATUS FOR IMAGING A FLUID PORTION IN A BODY

[75] Inventors: Atsushi Takane, Katsuta; Munetaka Tsuda, Mito; Hideaki Koizumi, Katsuta, all of Japan

[73] Assignee: Hitachi, Ltd., Tokyo, Japan

[21] Appl. No.: 853,789

[22] Filed: Mar. 19, 1992

[30] Foreign Application Priority Data

Mar. 20, 1991 [JP] Japan .................................. 3-057098

[51] Int. Cl.6 .............................................. G01R 33/20
[52] U.S. Cl. ..................................... 324/306; 324/309
[58] Field of Search ............... 324/300, 307, 309, 306; 128/653.3, 653.2

[56] References Cited

U.S. PATENT DOCUMENTS

| | | | |
|---|---|---|---|
| 4,521,733 | 6/1985 | Bottomley et al. | 324/309 |
| 4,613,949 | 9/1986 | Glover et al. | 324/309 |
| 4,718,424 | 1/1988 | Nishimura | 324/306 |
| 4,885,537 | 12/1989 | Suzuki | 324/306 |
| 4,915,111 | 4/1990 | Sano et al. | 324/306 |
| 4,962,763 | 10/1990 | Sato et al. | 324/306 |
| 5,148,109 | 9/1992 | Takane et al. | 324/309 |
| 5,189,369 | 2/1993 | Takane et al. | 324/306 |

OTHER PUBLICATIONS

IEEE Transactions on Medical Imaging vol. MI-5, No. 3, Sep. 1986.

*Primary Examiner*—Kenneth A. Wieder
*Assistant Examiner*—Raymond Y. Mah
*Attorney, Agent, or Firm*—Antonelli, Terry, Stout & Kraus

[57] ABSTRACT

Radio frequency pulses are repeatedly applied to a sample including a fluid portion positioned in a static magnetic field, so that spins of the sample are put into the steady-state free precession state so as to generate an FID signal just after the radio frequency pulse and generate a time-reversed FID signal just before the next radio frequency pulse. Both of the signals generated thus are detected and are subjected to image reconstruction process to image the fluid portion of the sample.

34 Claims, 4 Drawing Sheets

5,391,989

MAGNETIC RESONANCE IMAGING METHOD AND APPARATUS FOR IMAGING A FLUID PORTION IN A BODY

BACKGROUND OF THE INVENTION

1. Field of the Invention

The present invention relates to a magnetic resonance imaging method and apparatus, and more particularly, to a magnetic resonance imaging method and apparatus suitable for imaging of a fluid portion in the body such as blood flow and cerebrospinal fluid (CSF).

2. Description of the Prior Art

A method of imaging the fluid portion in the magnetic resonance imaging is discussed in detail in an article of IEEE TRANSACTION ON MEDICAL IMAGING, VOL. MI-5, NO. 2, SEPTEMBER 1986, PP 140-151. The imaging principle of the blood flowing portion is to utilize a pulse named a flow encode pulse and generating a phase shift by movement. In other words, when the flow encode pulse exists in a flowing direction, the phase shift occurs in accordance with a velocity. Subtraction between images is performed between the phase-sensitive pulse sequence including the flow-encode pulse and the phase-insensitive pulse sequence not including the flow encode pulse. Since blood flow in blood vessels is laminated, different phase shift occurs in accordance with a distance from a center of the blood vessel when imaging is made by the phase-sensitive pulse sequence. Consequently, projection data is canceled each other and no signal is generated from the blood vessels. On the other hand, in the phase-sensitive pulse sequence, since the phase is not shifted due to movement, a signal is generated from the blood vessels even in the laminated blood flow. In a stationary portion, a signal is generated in any pulse sequence, while when subtraction is made between the two pulse sequences, the signal of the stationary portion disappears, so that an image of only the blood vessels appears. This method is named the subtraction method.

According to such a technique, however, a signal is missing in a portion in which phase compensation in the phase-insensitive pulse sequence is not sufficient, for example, such as a portion in which a turbulent flow occurs or a portion in which an acceleration is provided, and it is difficult to judge whether the missing of the signal is caused by a disease or a trouble in measurement.

SUMMARY OF THE INVENTION

It is an object of the present invention to provide a magnetic resonance imaging method and apparatus capable of judging whether the missing of signal is caused by turbulent flow or acceleration or a disease.

According to the present invention, radio frequency pulses are repeatedly applied to a sample including a fluid portion positioned in a static magnetic field and spins in the sample are put in the steady-state free precession state so that a free induction decay (FID) signal is generated just after the radio frequency pulse and a time-reversed FID signal is generated just before the next radio frequency pulse. Both of the signals generated thus are detected and are subjected to the image reconstruction process so that the image of the fluid portion of the sample is constructed on the basis of the both of the detected signals.

The above and other objects and features will be apparent from the following description with reference to the accompanying drawings.

DESCRIPTION OF THE PREFERRED EMBODIMENT

Figure 1:
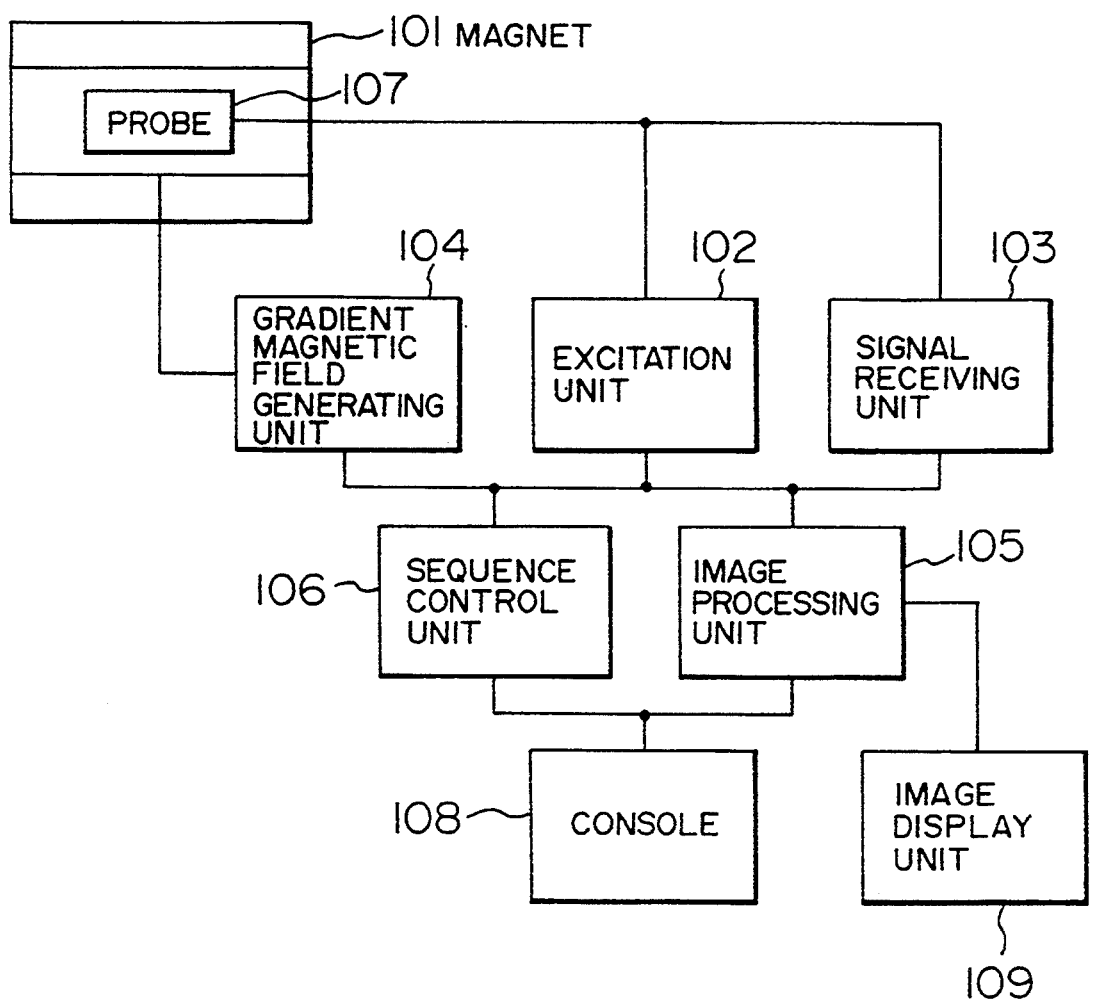
FIG. 1 is a block diagram schematically illustrating a magnetic resonance imaging apparatus of an embodiment according to the present invention.

Referring now to FIG. 1, numeral 101 denotes a magnet which generates a uniform static magnetic field and which may be a normally conductive magnet, a superconductive magnet or a permanent magnet. Numeral 102 denotes an excitation unit for generating a radio frequency magnetic field which generates a nuclear magnetic resonance in an object to be examined or in a sample. Numeral 103 denotes a signal receiving unit which receives a nuclear magnetic resonance signal generated from the sample for detection to convert it into a digital signal. Numeral 104 denotes a gradient magnetic field generating unit capable of changing the intensity of a magnetic field into X, Y and Z directions independently and linearly. Numeral 105 denotes an image processing unit for performing various operations necessary for the image reconstruction on the basis of data from the receiving unit 103 and which may be a computer. Numeral 106 denotes a sequence control unit for controlling operation timings of the units, 107 a probe used to transmit and receive the radio frequency signal, 108 a console for performing operations, and 109 an image display unit for displaying an image of the sample.

Figure 2:
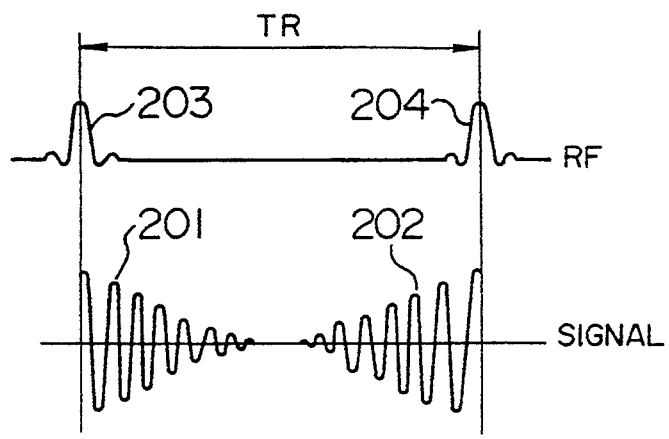
FIG. 2 shows a radio frequency pulse and a signal generated thereby for explaining the steady-state free precession state which is a basis of the present invention.

When radio frequency pulses are applied to the sample with an extremely short repetition time (TR) as compared with the spin-lattice relaxation time and the spin-spin relaxation time of the sample, the steady-state free precession (SSFP) occurs, so that a free induction decay (FID) signal is generated just after the radio frequency pulse and a time-reversed FID signal is generated just before the radio frequency pulse. The time-reversed FID signal is a signal caused by the radio frequency signal generated precedently by two signals and the radio frequency signal generated precedently by one signal. In FIG. 2, numeral 201 represents the FID signal generated just after a radio frequency pulse 203 in the steady-state free precession (SSFP) state and numeral 202 represents the time-reversed FID signal generated just before a radio frequency pulse 204 in the SSFP state.

Figure 3:
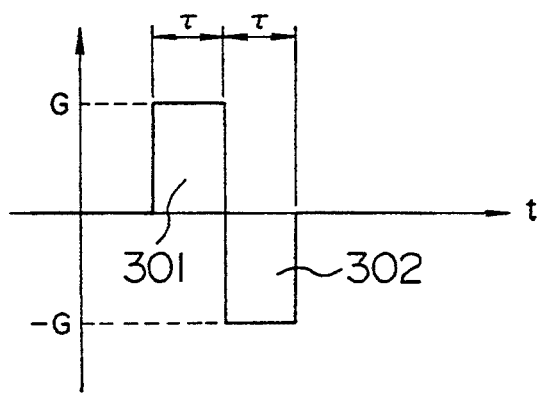
FIG. 3 shows a flow encode pulse used in an embodiment of the present invention.

FIG. 3 shows a gradient magnetic field application pattern of phase-sensitive type which produces phase shift in a fluid portion and is named a flow encode pulse.

Gradient magnetic field pulses 301 and 302 have the same amplitude (G) and time width $\tau$ but have polarities opposite to each other. When a velocity of fluid flowing in the fluid portion is V, the phase shift $\theta$ of the spin of the fluid portion applied with the gradient magnetic field shown in FIG. 3 is proportional to the velocity V.

Figure 4:
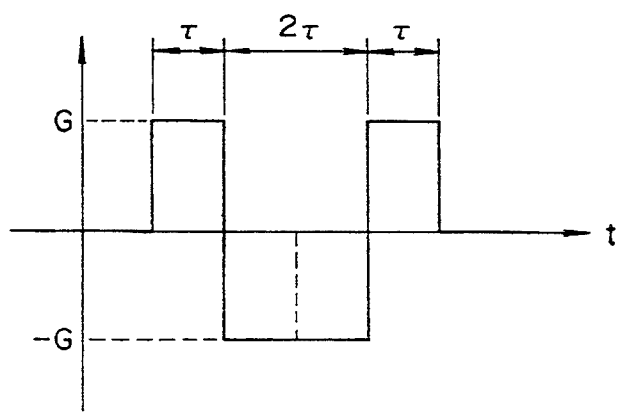
FIG. 4 shows a phase-sensitive flow encode pulse used in an embodiment of the present invention.

FIG. 4 shows a gradient magnetic field application of phase-insensitive type for correcting the phase shift of the spin of the fluid body. This pattern is formed of two flow encode pulses generated continuously with one of them reversed. The phase shift of the spin of the fluid portion applied with the gradient magnetic field is reduced to zero without influence of the velocity V.

Figure 5:
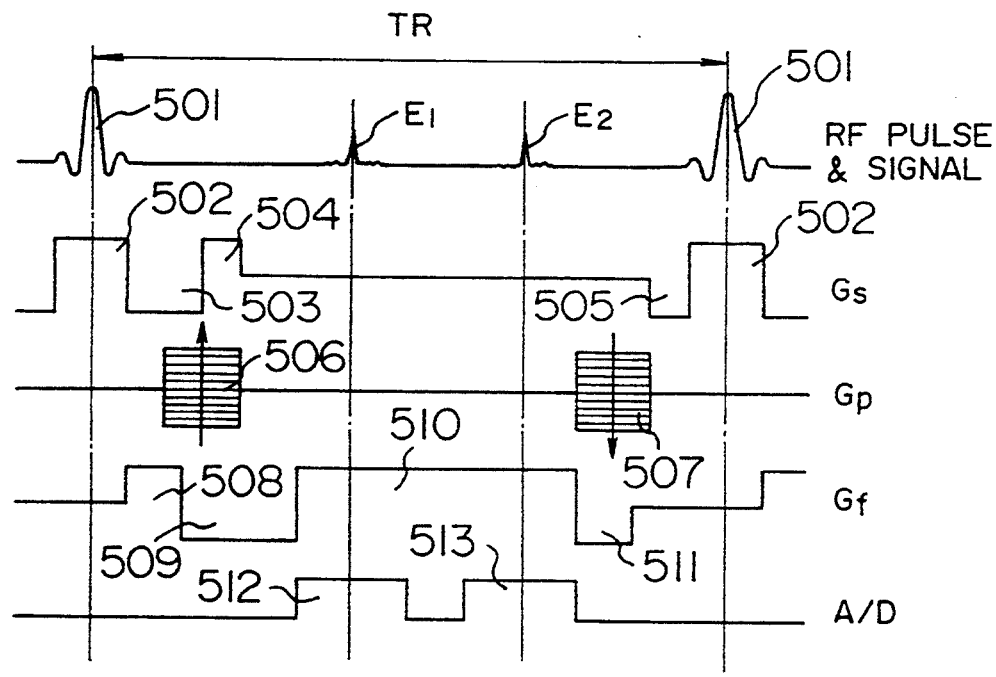
FIG. 5 is a diagram showing a pulse sequence used in an embodiment of the present invention.

FIG. 5 shows a two-dimensional pulse sequence in which the two signals (generated just after and before the radio frequency pulse) in the SSFP state are sampled and the fluid portion is imaged from the signal generated just after the radio frequency as a high signal area while the fluid portion is imaged from the signal generated just before the radio frequency as a low signal area in which a signal is missing.

A slice to be imaged is selected by a slice selecting gradient magnetic field ($G_s$) 502 and the selected slice is excited by a radio frequency pulse 501 having any angle (preferably 90 degrees or less and larger than 0 degree). At this time, the repetition time (TR) is extremely shortened as compared with the spin-lattice relaxation time and the spin-spin relaxation time of spins in the slice, so that the spins in the slice is put into the SSFP state. In this state, the FID signal is generated just after the radio frequency pulse and the time-reversed FID signal is generated just before the next radio frequency signal. Thus, the FID signal generated just after the radio frequency pulse is subjected to the frequency encode gradient magnetic fields ($G_f$) 508, 509 and 510 to generate an echo signal $E_1$ and the echo signal is read during a period 512 by means of the frequency encode gradient magnetic field ($G_f$) 510 to be sampled for A/D conversion. Further, the signal generated just before the radio frequency pulse is subjected to the frequency encode gradient magnetic fields ($G_f$) 510 and 511 to generate an echo signal $E_2$ and the echo signal is read during a period 513 by means of the frequency encode gradient magnetic field ($G_f$) 510 to be sampled for A/D conversion. The above steps are repeated plural times. However, a phase encode value of the phase encode gradient magnetic fields ($G_p$) 506 and 507 are varied by a fixed value in each step. The frequency encode gradient magnetic field ($G_f$) 510 is named a read-out gradient magnetic field ($G_r$) since it is used for reading of a signal. Magnetic fields 503, 504 and 505 are used to rephase a phase of the spins disturbed in the slice direction by the slice selecting gradient magnetic field ($G_s$) 502, while the gradient magnetic fields ($G_s$) 502, 503 and 504 form a phase-insensitive gradient magnetic field application pattern which minimizes the phase shift of the spins of the fluid to zero and the gradient magnetic fields ($G_s$) 505 and 502 form a phase-sensitive gradient magnetic field application pattern which produces the phase shift in the spins of the fluid portion. The gradient magnetic field ($G_p$) 507 is applied so that an absolute value thereof is equal to that of the gradient magnetic field ($G_p$) 506 and a sign thereof is opposite to that of the gradient magnetic field ($G_p$) 506 so as to return the phase shift of the spins by the gradient magnetic field ($G_p$) 506 to its original state after sampling for A/D conversion. The gradient magnetic fields ($G_f$) 508, 509, 510 and 511 are applied to frequency-encode signals and to cause the FID signals generated just before and after the radio frequency pulses to be generated as echo signals $E_1$ and $E_2$, respectively, while the gradient magnetic fields ($G_f$) 508, 509 and 510 form the phase-insensitive gradient magnetic field application pattern and the gradient magnetic fields ($G_f$) 510 and 511 form the phase-sensitive gradient magnetic field application pattern.

When the FID signal and the time-reversed FID signal obtained by using the above pulse sequence are subjected to the image reconstruction processing, a high signal intensity image is obtained from the signal sampled during the period 512 and a low signal intensity image is obtained from the signal sampled during the period 513 to be displayed in the image display unit 109.

At this time, the fluid portion is imaged as a high signal intensity area from the signal sampled during the period 512 since there is no phase shift of the spins due to flow. However, complicated turbulence of the phase of spins occurs in the flow portion having turbulent flow or acceleration and since the phase shift can not be minimized to zero exactly, a signal is missing. Accordingly, it is difficult to identify whether the missing of the signal is caused by the stricture or disease of the fluid portion or turbulence of flow, that is, turbulent flow or acceleration. On the contrary, with the signal sampled during the period 513, the spins of the fluid portion produce the phase shift to be de-phased and since the fluid portion is thus imaged as the low signal area as compared with other tissue (stationary portion), the shape of the fluid portion can be grasped. Accordingly, by observing and comparing the two images, whether the missing of signal occurred in the fluid portion of the image by the signal sampled during the period 512 is caused by the stricture of the fluid portion or the turbulence of flow can be judged. When the missing of signal is caused by the turbulence of flow, correction can be made so that the missing is not observed.

As the correction method in this case, there is a method in which weighting and adding processes are made between the two images. For example, when signal intensities of the two images are A and B, a correction process of nA+mB (where n and m are constants) is made. It is a matter of course that this process is made in the image processing unit 105.

As another correction method, there is a method in which the two images are colored with different colors, respectively, and superimposed on each other to be displayed. Thus, since the fluid portions of the two images are imaged with different colors, a portion which does not appear in the respective images can be confirmed or corrected. The colored and superimposed display of the two images can be attained by using a color display as the image display unit 109.

Further, as a method of obtaining an image having higher brightness for the other tissue of the fluid portion, subtraction process can be made between the two image data obtained simultaneously. It is a matter of course that this process is also made by the image processing unit 105.

In this connection, when the slice selecting gradient magnetic field ($G_s$), the phase encode gradient magnetic field ($G_p$) and the read-out gradient magnetic field ($G_r$) are caused to coincide with the Z, Y and X axes of the rectangular coordinate system, respectively, two-dimensional imaging of the slice plane vertical to the Z axis can be made.

Figure 6:
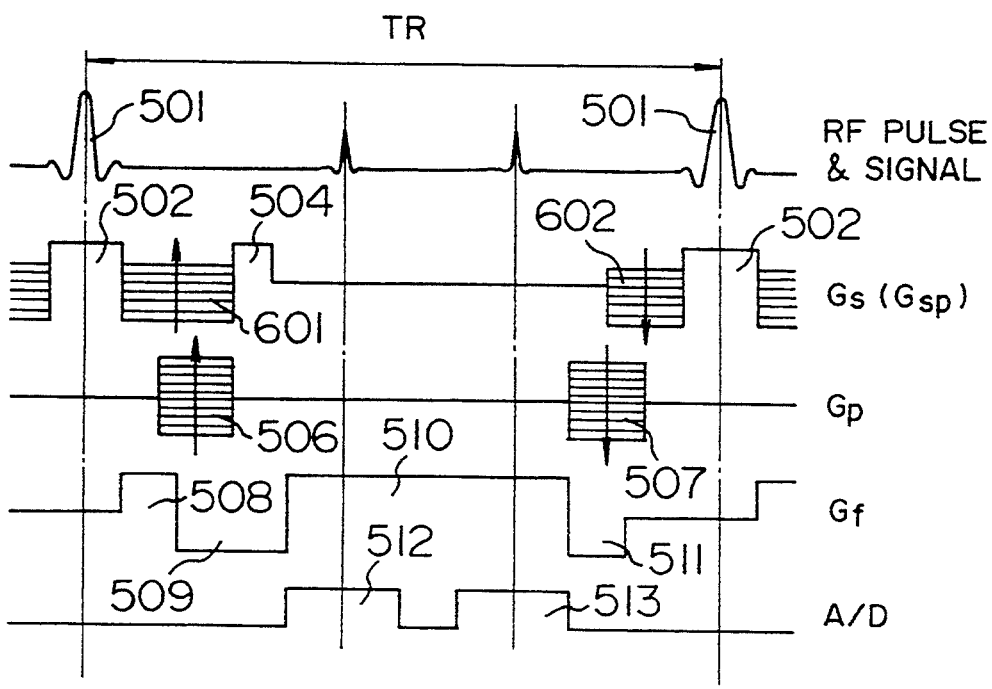
FIG. 6 is a diagram showing a further pulse sequence used in an embodiment of the present invention.

FIG. 6 shows a pulse sequence for three-dimensional measurement. Numerals 601 and 602 represent phase encode gradient magnetic fields ($G_{sp}$) in the slicing direction. A relation between the gradient magnetic fields ($G_{sp}$) 601 and 602 is set so that the absolute values thereof are equal to each other. and the signs thereof are opposite to each other so as to return the phase shift to the original state after sampling for A/C conversion. Other respects are the same as those of FIG. 5.

In the imaging of the fluid portion, when a two-dimensional image projected to any plane from the three-dimensionally measured image data and the three-dimensional image data by the two-dimensional multi-slice measurement is prepared, a projection image is prepared utilizing a pixel having a maximum value of a plurality of pixels for the original three-dimensional image data as a projection pixel in respect to the image data for the signal generated Just after the radio frequency pulse (Maximum intensity projection method). Thus, the fluid portion can be imaged as the high signal area. Further, in respect to the image data for the signal generated just before the radio frequency pulse, a projection image is prepared utilizing a pixel having a minimum value of the plurality of pixels for the. original three-dimensional image data as a projection pixel (Minimum intensity projection method). Thus, the fluid portion can be imaged as the low signal area.

As a further method, there is a method in which subtraction process is made between two pairs of original three-dimensional image data and after one pair of three-dimensional image data has been prepared, the projection image is prepared utilizing a pixel having a maximum value of the plurality of pixels used in the projection as a projection pixel (Maximum intensity projection method) and the fluid portion is imaged as the high signal area.

Figure 7:
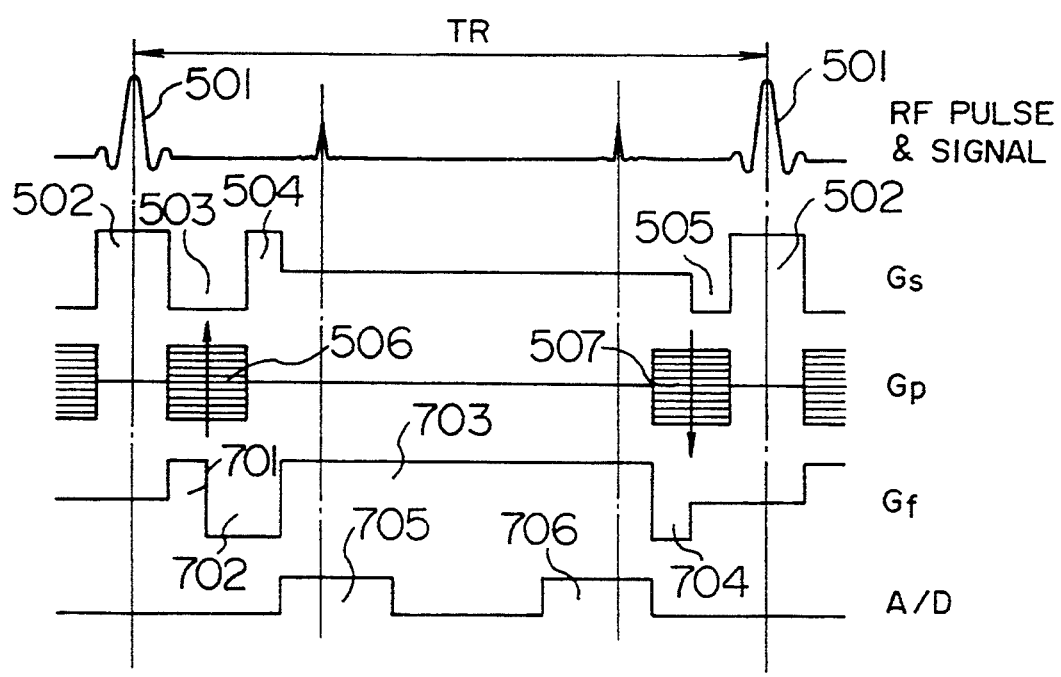
FIG. 7 is a diagram showing a still further pulse sequence used in an embodiment of the present invention.

FIG. 7 shows a pulse sequence used when the echo signals are asymmetrically measured. Usually, the echo signals are subjected to the so-called symmetrical measurement so that a peak value of the echo signals is positioned in the middle of the sampling section for A/D conversion, while in FIG. 7 in order to obtain a higher signal by extremely reducing the phase shift of spins of the fluid portion in respect to the FID signal generated just after the radio frequency pulse and to obtain a lower signal by extremely increasing the phase shift in respect to the time-reversed FID signal generated just before the radio frequency pulse, the echo signals are shifted before and after the middle of the sampling section for A/D conversion to be subjected to the asymmetrical measurement. More particularly, the gradient magnetic fields ($G_f$) 701, 702 and 703 constitute the phase-insensitive gradient magnetic application pattern, while since the application amount thereof is reduced as compared with the gradient magnetic fields 508 and 509 of FIGS. 5 and 6, the echo signal is generated before the middle of the A/D sampling section 705. Further, the gradient magnetic fields ($G_f$) 703 and 704 constitute the phase-sensitive gradient magnetic field application pattern, while since the application amount thereof is reduced as compared with the gradient magnetic field ($G_f$) 511 of FIGS. 5 and 6, the echo signal is generated after the middle of the A/D sampling section 706.

In FIG. 7, the same elements as those in other figures or the elements corresponding to those of other figures are designated by the same reference numerals.

As apparent from the foregoing description, the FID signal and the time-reversed FID signal generated in the steady-state free precession state are measured by the phase-insensitive gradient magnetic field application pattern and the phase-sensitive gradient magnetic field application pattern, respectively, so that the high signal intensity image and the low signal intensity image of the fluid portion can be obtained simultaneously at high speed. Further, the obtained images are compared and subjected to the inter-image operation to be composed, so that a shape of the fluid portion can be exactly grasped and the fluid portion having gentle stream, which is difficult to be imaged heretofore, can be also imaged.

Many variations and modifications can be made by those skilled in the art without departing from the essence of the present invention and accordingly it should be understood that the present invention is not limited to the details described above.

We claim:

1. A magnetic resonance imaging method comprising the steps of repeatedly applying radio frequency pulses to a sample including a fluid portion positioned in a static magnetic field in the presence of gradient magnetic fields so that spins in said sample are put in a steady-state free precession state so as to generate an FID signal just after a first radio frequency pulse and generate a time-reversed FID signal just before a second radio frequency pulse generated following said first radio frequency pulse, detecting both of said generated signals during a repetition time, and reconstructing an image from both of said detected signals to image said fluid portion.

2. A nuclear magnetic resonance imaging method according to claim 1, wherein said detecting step comprises detecting both of said FID signals as echo signals, respectively.

3. A nuclear magnetic resonance imaging method according to claim 2, wherein said echo signal corresponding to said FID signal generated just after said first radio frequency pulse is obtained in the presence of a gradient magnetic field application pattern which is insensitive to the phase of spins of said fluid portion and said echo signal corresponding to said time-reversed FID signal is obtained in the presence of a gradient magnetic field application pattern which is sensitive to the phase of spins of said fluid portion.

4. A magnetic resonance imaging method comprising the steps of placing a sample in a static magnetic field, applying radio frequency pulses to said sample in the presence of a slice selecting gradient magnetic field to select a slice including a fluid portion of said sample and repeating the application of said radio frequency pulses so that spins in said slice are put in a steady-state free precession state so as to generate an FID signal just after a first radio frequency pulse and generate a time-reversed FID signal just before a second radio frequency pulse generated following said first radio frequency pulse, detecting both of said generated signals during a repetition time, and reconstructing an image from both of said detected signals to image said fluid portion of said slice.

5. A magnetic resonance imaging method according to claim 4, wherein said detecting step comprises detecting both of said FID signals as echo signals, respectively.

6. A magnetic resonance imaging method according to claim 5, wherein said detecting step comprises reading both of said echo signals in the presence of read-out gradient magnetic fields.

7. A magnetic resonance imaging method according to claim 6, wherein said read-out gradient magnetic fields are asymmetrical to each of said echo signals.

8. A magnetic resonance imaging method according to claim 6, wherein said echo signal corresponding to said FID signal generated just after said first radio frequency pulse is obtained in the presence of a gradient magnetic field application pattern which is insensitive to the phase of spins of said fluid portion and said echo signal corresponding to said time-reversed FID signal is obtained in the presence of a gradient magnetic field application pattern which is sensitive to the phase of spins of said fluid portion.

9. A magnetic resonance imaging method comprising the steps of placing a sample in a static magnetic field, applying radio frequency pulses to said sample in the presence of a slice selecting gradient magnetic field to select a slice including a fluid portion of said sample and repeating the application of said radio frequency pulses so that spins in said slice are put in a steady-state free precession state so as to generate an FID signal just after a first radio frequency pulse and generate a time-reversed FID signal just before a second radio frequency pulse generated next to said first radio frequency pulse, detecting both of said generated signals during a repetition time as echo signals so that the detection of one of said echo signals is attained in the presence of a gradient magnetic field application pattern which is insensitive to the phase of spins of said fluid portion and the detection of the other of said echo signals is attained in the presence of a gradient magnetic field application pattern which is sensitive to the phase of spins of said fluid portion, and reconstructing an image from both of said detected echo signals to image said fluid portion.

10. A magnetic resonance imaging method according to claim 9, further comprising a step of composing image-reconstructed signals.

11. A magnetic resonance imaging apparatus comprising means for repeatedly applying radio frequency pulses to a sample including a fluid portion positioned in a static magnetic field in the-presence of a gradient magnetic field so that spins in said sample are put in a steady-state free precession state so as to generate an FID signal just after a first radio frequency pulse and generate a time-reversed FID signal Just before a second radio frequency pulse generated following said first radio frequency pulse, means for detecting both of said generated signals during a repetition time, and means for reconstructing an image from both of said detected signals to image said fluid portion.

12. A nuclear magnetic resonance imaging apparatus according to claim 11, wherein said detecting means comprises means for detecting both of said FID signals as echo signals, respectively.

13. A nuclear magnetic resonance imaging apparatus according to claim 12, wherein said echo signal corresponding to said FID signal generated just after said first radio frequency pulse is obtained in the presence of a gradient magnetic field application pattern which is insensitive to phase of spins of said fluid portion and said echo signal corresponding to said time-reversed FID signal is obtained in the presence of a gradient magnetic field application pattern which is sensitive to phase of spins of said fluid portion.

14. A magnetic resonance imaging apparatus comprising means for placing a sample in a static magnetic field, means for applying radio frequency pulses to said sample in the presence of a slice selecting gradient magnetic field to select a slice including a fluid portion of said sample and repeating the application of said radio frequency pulses so that spins in said slice are put in a steady-state free precession state so as to generate an FID signal Just after a first radio frequency pulse and generate a time-reversed FID signal just before a second radio frequency pulse generated following said first radio frequency pulse, means for detecting both of said generated signals during a repetition time, and means for reconstructing an image from both of said detected signals to image said fluid portion of said slice.

15. A magnetic resonance imaging apparatus according to claim 14, wherein said detecting means comprises means for detecting both of said FID signals as echo signals, respectively.

16. A magnetic resonance imaging apparatus according to claim 15, wherein said detecting means comprises means for reading both of said echo signals in the presence of read-out gradient magnetic fields.

17. A magnetic resonance imaging apparatus according to claim 16, wherein said read-out gradient magnetic fields are asymmetrical to each of said echo signals.

18. A magnetic resonance imaging apparatus according to claim 16, wherein said echo signal corresponding to said FID signal generated just after said first radio frequency pulse is obtained in the presence of a gradient magnetic field application pattern which is insensitive to the phase of spins of said fluid portion and said echo signal corresponding to said time-reversed FID signal is obtained in the presence of a gradient magnetic field application pattern which is sensitive to the phase of spins of said fluid portion.

19. A magnetic resonance imaging apparatus comprising means for placing a sample in a static magnetic field, means for applying radio frequency pulses to said sample in the presence of a slice selecting gradient magnetic field to select a slice including a fluid portion of said sample and repeating the application of said radio frequency pulses so that spins in said slice are put in a steady-state free precession state so as to generate an FID signal just after a first radio frequency pulse and generate a time-reversed FID signal just before a second radio frequency pulse generated following said first radio frequency pulse, means for detecting both of said generated signals during a repetition time as echo signals so that the detection of one of said echo signals is attained in the presence of a gradient magnetic field application pattern which is insensitive to the phase of spins of said fluid portion and the detection of the other of said echo signals is attained in the presence of a gradient magnetic field application pattern which is sensitive to the phase of spins of said fluid portion, and means for reconstructing an image from both of said detected echo signals to image said fluid portion.

20. A magnetic resonance imaging apparatus according to claim 19, further comprising means for composing image-reconstructed signals.

21. A method according to claim 3, wherein said FID signal is subjected to a phase insensitive processing and said time-reversed FID signal is subjected to a phase sensitive processing.

22. A method according to claim 8, wherein said FID signal is subjected to a phase insensitive processing and said time-reversed FID signal is subjected to a phase sensitive processing.

23. A method according to claim 9, wherein said FID signal is subjected to a phase insensitive processing and said time-reversed FID signal is subjected to a phase sensitive processing.

24. An apparatus according to claim 13, comprising means for subjecting said FID signal to a phase insensitive processing and said time-reversed FID signal to a phase sensitive processing.

25. An apparatus according to claim 18, comprising means for subjecting said FID signal to a phase insensitive processing and said time-reversed FID signal to a phase sensitive processing.

26. An apparatus according to claim 19, comprising means for subjecting said FID signal to a phase insensitive processing and said time-reversed FID signal to a phase sensitive processing.

27. A magnetic resonance imaging apparatus comprising:
   (a) means for repeatedly applying radio frequency pulses to a sample including a fluid portion positioned in a static magnetic field and a gradient magnetic field to generate an FID signal after a first radio frequency pulse and generate a time-reversed FID signal before a second radio frequency pulse generated following said first radio frequency pulse;
   (b) means for detecting both of said generated signals during a repetition time; and
   (c) means for reconstructing an image from both of said detected signals to image said fluid portion;
wherein said FID signal is subjected to phase insensitive processing and said time-reversed FID signal is subjected to a phase sensitive processing.

28. An apparatus according to claim 27, comprising means for placing spins in said sample in a steady-state free precession state.

29. A method according to claim 1, wherein the step of reconstructing an image from both of said detected signals includes forming an image in accordance with the detected FID signal and an image in accordance with the detected time-reversed FID signal.

30. A method according to claim 29, wherein the step of reconstructing an image from both of said detected signals includes combining the image in accordance with the FID signal and the image in accordance with the time reversed FID signal to image said fluid portion.

31. A method according to claim 4, wherein the step of reconstructing an image from both of said detected signals includes forming an image in accordance with the detected FID signal and an image in accordance with the detected time-reversed FID signal.

32. A method according to claim 31, wherein the step of reconstructing an image from both of said detected signals includes combining the image in accordance with the FID signal and the image in accordance with the time reversed FID signal to image said fluid portion.

33. A method according to claim 9, wherein the step of reconstructing an image from both of said detected signals includes forming an image in accordance with the detected FID signal and an image in accordance with the detected time-reversed FID signal.

34. A method according to claim 33, wherein the step of reconstructing an image from both of said detected signals includes combining the image in accordance with the FID signal and the image in accordance with the time reversed FID signal to image said fluid portion.

* * * * *